US012567451B2

(12) United States Patent
Brecte et al.

(10) Patent No.: US 12,567,451 B2
(45) Date of Patent: Mar. 3, 2026

(54) MAGNETO RESISTIVE MEMORY DEVICE

(71) Applicant: CENTRE NATIONAL DE LA RECHERCHE SCIENTIFIQUE, Paris (FR)

(72) Inventors: Victorien Brecte, Aix-en-Provence (FR); Julien Louche, Saint-Martin-le-Vinoux (FR); Fabien Leroy, Grenoble (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 98 days.

(21) Appl. No.: 18/727,465

(22) PCT Filed: Dec. 28, 2022

(86) PCT No.: PCT/EP2022/087946
§ 371 (c)(1),
(2) Date: Jul. 9, 2024

(87) PCT Pub. No.: WO2023/135019
PCT Pub. Date: Jul. 20, 2023

(65) Prior Publication Data
US 2025/0069633 A1 Feb. 27, 2025

(30) Foreign Application Priority Data
Jan. 11, 2022 (EP) .................................... 22315011

(51) Int. Cl.
G11C 11/16 (2006.01)
(52) U.S. Cl.
CPC ...... G11C 11/1673 (2013.01); G11C 11/1659 (2013.01)

(58) Field of Classification Search
CPC ............ G11C 11/1673; G11C 11/1659; G11C 11/1655; G11C 11/1657; G11C 11/18
(Continued)

(56) References Cited

U.S. PATENT DOCUMENTS

| 2005/0083773 A1* | 4/2005 | Hidaka | G11C 11/15 |
| | | | 365/232 |
| 2008/0117670 A1* | 5/2008 | Hidaka | G11C 11/1657 |
| | | | 365/171 |

(Continued)

FOREIGN PATENT DOCUMENTS

| EP | 2363862 A1 | 9/2011 |
| EP | 3848933 A1 | 7/2021 |
| JP | 2011146124 A | 7/2011 |

OTHER PUBLICATIONS

International Search Report issued on Mar. 22, 2023, in corresponding International Application No. PCT/EP2022/087946, 3 pages.

(Continued)

*Primary Examiner* — Michael T Tran
(74) *Attorney, Agent, or Firm* — Maier & Maier, PLLC

(57) ABSTRACT

A magneto resistive memory device including a memory array with at least one bit line (BL) and at least one source line (SL, SLB), the bit line (BL) and the at least one source line (SL, SLB) associated with a plurality of memory cells each presenting a magnetic tunnel junction and each presenting at least one selection transistor (RT) to selectively connect the bit line (BL). The memory array also includes a peripheral block configured to apply a first voltage (Vread) greater than ground voltage (Vss) on the bit line (BL) and applying a second voltage (VSL) greater than the first voltage (Vread) on the at least one source line (SL, SLB). The state stored in the selected cell is detected by using a (Continued)

sense amplifier (SA) of the peripheral block associated with the at least one bit line (BL) to sense the current flowing in the bit line (BL).

9 Claims, 4 Drawing Sheets

(58) Field of Classification Search
USPC ................................................. 365/158, 173
See application file for complete search history.

(56) References Cited

U.S. PATENT DOCUMENTS

| | | | |
|---|---|---|---|
| 2010/0046310 A1* | 2/2010 | Joo | G11C 11/406 |
| | | | 365/207 |
| 2010/0208515 A1* | 8/2010 | Aoki | B82Y 25/00 |
| | | | 365/171 |
| 2017/0004867 A1* | 1/2017 | Roy | G11C 11/15 |
| 2022/0114427 A1* | 4/2022 | Jung | G06N 3/045 |
| 2022/0384523 A1* | 12/2022 | Wu | G11C 11/2257 |

OTHER PUBLICATIONS

The Extended European Search Report dated Oct. 6, 2022, in corresponding European Application No. 22315011.1, 13 pages.

* cited by examiner

S1 : Apply Vread >= Vss on the bit line

S2 : Apply VSL >= Vread on the source line

S3 : flow read current from the source line to the bit line

S4 Sense the read current

MAGNETO RESISTIVE MEMORY DEVICE

FIELD

The present invention relates to a magneto resistive memory device.

BACKGROUND

A magneto resistive memory cell of a magnetic memory
device typically includes a magnetic tunnel junction struc-
ture 2 comprising a thin dielectric layer 2a sandwiched
between a ferromagnetic free layer 2b and a ferromagnetic
pinned layer 2c. The dielectric layer 2a forms a tunnel
barrier layer between the pinned layer 2c and the free layer
2b. The orientation of the magnetization of the ferromag-
netic pinned layer 2c is fixed, for instance perpendicular to
the substrate. The magnetization orientation of the free layer
2b is switchable in the perpendicular axis into one of a
parallel state or an antiparallel state with respect to the
magnetization orientation of the pinned layer 2b. The free
layer may comprise material selected in the list constituted
of Fe, Co, Ni, FeCo, CoNi, CoFeB, FeB, FePt, FePd or other
suitable ferromagnetic material. The pinned layer 2c may
comprise materials selected in the list constituted of Fe, Co,
Ni, FeCo, CoNi, CoFEB, FeB, FePt, FePd or other suitable
ferromagnetic material. Finally, the dielectric layer 2a may
comprise MgO, Al2O3 or other suitable dielectric materials.

The resistance value between the pinned layer 2c and the
free layer 2b is dependent on the actual state of the free layer
magnetization orientation. When the free layer 2b and the
pinned layer 2c have parallel magnetizations, the magnetic
tunnel junction presents a relatively lower electric resis-
tance, whereas in the antiparallel magnetizations the mag-
netic tunnel junction presents a relatively higher electric
resistance. The switchable relative magnetization orientation
of the free layer 2b defines therefore two states of the
memory cell 1, to respectively represents the "0" and "1"
values of a bit of information.

In a read operation according to the state of the art, a
selection signal turns on a read transistor to flow a read
current through the magnetic tunnel junction 2. By sensing
the read current, it is possible to identify the electric resis-
tance of the magnetic tunnel junction, which is dependent on
the relative orientation of the magnetization of the pinned
layer 2c and of the free layer 2b as mentioned above, and
hence of the state store in the memory cell.

FIG. 1a to FIG. 1c illustrate such a reading operation of
a magneto resistive memory cell according to different
known architectures.

In FIG. 1a, a bit line BL is connected to a first side of a
magnetic tunnel junction (MTJ) 2 of a spin orbit torque
(SOT) memory cell. In this respect the MTJ 2 lies on a SOT
layer, as this is well known in the art. The MTJ is also
disposed between two source lines SL, SLB, which are
selectively connected to a second side of the MTJ, opposed
to the first side, through respective selection transistors RT.
The two selection transistors RT are controlled, via their
respective gates, through a selection line WL. The respective
sources S of the selection transistors (here NMOS transistors) are connected to the source lines SL, SLB, and their
drain D to one side of the MTJ2. For avoidance of doubt, it
is recall that for NMOS transistor, the source is defined as
the electrode (among the two electrodes disposed on each
side of the channel) that receives the lowest potential, and
the drain is defined as the electrode that receive the highest
potential. For reading the state stored in the MTJ 2, the selection line WL is set to connect the two source lines SL,
SLB to the second side of the MTJ 2. A read voltage Vread
is applied to the bit line BL and therefore to the first side of
the MTJ 2. The two source lines SL, SLB are set to ground.
With the selection transistor so polarized, a read current is
flowing through the MTJ, from the bit line BL, to each one
of the source lines SL, SLB. The read current is sensed to
determine the state stored in the MTJ 2, as explained above.

FIG. 1b represents another conventional architecture of a
memory cell comprising a SOT memory cell comprising a
MTJ 2 during a read operation. In this architecture a source
line SL is selectively connected to a first side of the magnetic
tunnel junction 2 through a single selection transistor RT.
The selection transistor RT is controlled through a first
selection line WL connected to its gate. The drain D of the
selection transistor RT is connected on a side of the MTJ 2,
and its source S to the source line BL. The second side of the
MTJ 2 is connected to a bit line BL. To be complete, the
source line SL is also selectively connected to the second
side of the MTJ through a write selection transistor WT
whose state is determined by a second selection line WL'.
During a read operation, the first selection line WL is set to
close the read selection transistor RT and the second selec-
tion line WL' is set to open the write selection transistor WT.
The read voltage Vread applied to the bit line BL is therefore
also applied to the second side of the MTJ 2. The source line
SL is set to ground. Consequently, a read current is flowing
through the MTJ 2, from the bit line BL to source line SL.
The read current is sensed to determine the state stored in the
MTJ 2, as explained above.

FIG. 1c represents a further conventional architecture of
a memory cell during a read operation and comprising this
time a spin transfer torque (STT) memory cell, comprising
a MTJ 2. In this architecture a source line SL is selectively
connected to a first side of the magnetic tunnel junction 2
through a selection transistor RT. The selection transistor RT
is controlled, open or closed, through a selection line WL
connected to its gate. The second side of the MTJ 2 is
connected to a bit line BL. The source of the selection
transistor is connected to the source line SL, and its drain to
one side of the MTJ 2. During a read operation, the selection
line is set to close the selection transistor RT. The read
voltage Vread applied to the bit line BL is therefore also
applied to the first side of the MTJ 2. The source line SL is
set to ground. Consequently, a read current is flowing
through the MTJ 2, from the bit line BL to source line SL.
The read current is sensed to determine the state stored in the
MTJ 2, as explained above.

FIG. 1d represents the polarization state of the selection
transistor RT during a read operation in the different prior art
architecture presented on FIGS. 1a to 1c.

In a conventional magneto restive memory device, the
memory cells are arranged in an array, a plurality of memory
cells being disposed along a single bit line extending across
one direction of the array to define a column of memory
cells. The memory cell to be read in a column is connected
to the bit line BL by setting the selection lines WL at a high
level, that is closing the selection transistor(s) RT. The other
memory cells of the column are disconnected from the bit
line BL by setting the selection line WL to a low level.

By way of illustration, the FIG. 2 represents such a
column of memory cells according to the architecture of
FIG. 1a.

In all the represented architectures in FIGS. 1a to 1c, the
read voltage Vread that is applied to the bit line BL should
be relatively low to stay below the breakdown voltage of the
junction and to limit the intensity of the read current Ion flowing across the MTJ 2 under the write current threshold of this MTJ 2. Leakage current Ioff that flows through each unselected memory cell of the column adds to the read current Ion flowing through the selected memory cell. The number of unselected memory cells in a column being generally important, greater than 100, and the read current Ion of a single selected memory cell being necessarily limited, it may become difficult to discriminate the actual state of this selected memory cell from the current sense on the source line(s) SL, SLB.

It is noted that the ratio Ion/Ioff of the selection transistors RT is dependent of the source to drain voltage Vds of that transistor: the lower the source to drain voltage Vds, the lower this ratio. In the present application, this voltage is corresponding the read voltage Vread, that must be limited to control the read current to be lower than the write current threshold of the MTJ. Also, it is generally preferable to limit the read voltage to favorize the tunnel magnetoresistance effect in the MTJ 2 and improve the reliability of the read operation by providing a better difference of resistance between the parallel state and antiparallel state of the MTJ 2. Consequently, the Ion/Ioff ratio is relatively low in state-of-the-art memory array. In such a state-of-the-art memory array, the agglomerated leakage currents from the unselected memory cells may be of the same order (or even greater) than the read current Ion flowing in the selected memory cell. Also, the leakage current is increasing with temperature such that, even when the number of memory cells associated to a bit line is limited, the agglomeration of the leakage currents Ioff may mask the read current Ion and affect the reliability of a read operation.

For instance, simulation results have shown that in the architecture shown in FIG. 1*a* with the selection transistors RT being NMOS transistor, a read current Ion could reach 10 microA, a leakage current Ioff could reach 332 nA, and hence a Ion/Ioff ratio of about 30.

In certain architecture, such as the one shown on FIG. 1*a* or 1*c*, the selection transistor RT is also driving a write current to write a given cell in the MTJ 2. This write current presents a relatively high intensity, of the order of 100 micro A or more for SOT, and the selection transistor RT should be dimensioned to be able to drive such a current in a write operation while having a size as small as possible to keep the memory array of reasonable dimensions. This incites to design the selection transistor RT with a relatively small threshold voltage such that, all other dimension parameters and polarization being equals, more current may flow through the transistor. A relatively lower threshold voltage tends, however, to provide a relatively higher level of leakage current.

Consequently, known magneto resistive memory array and memory cells presents a relatively low reliability (in particular a limited read margin) and relatively high power consumption.

The large-scale integration of magneto resistive memory devices requires improvements to the architecture proposed in the state of the art just outlined above. In general terms, the object of the present invention is to propose a method for reading the state stored in a selected cell of a magneto resistive memory array, the method being more reliable than prior arts methods. The object of the present invention is also to propose a memory device configured to operate such a method. The memory device according to the invention may exhibit a reduced power consumption and/or reduced dimensions when compared to the memory device according to the state of the art.

SUMMARY

To this effect, the invention relates to a method for reading the state stored in a selected memory cell of a magneto resistive memory device comprising:

a memory array comprising a plurality of memory cells, at least one bit line associated to each memory cell of the plurality and at least one source line associated to each memory cell of the plurality, each memory cell presenting a magnetic tunnel junction associated to at least one selection transistor to selectively connect the at least one bit line, the magnetic tunnel junction and the at least one source line to define a read path, the selection transistor comprising a source connected to the bit line via the magnetic tunnel junction and a drain connected to the source line;

a peripheral block comprising a sense amplifier associated with the at least one bit line to determine a read current flowing along the read path.

According to the invention, the method comprises:

applying a first voltage greater than ground voltage on the bit line and applying a second voltage greater than the first voltage on the at least one source line;

flowing a read current in the read path from the at least one source line to the bit line;

sensing the current flowing in the bit line and detecting the state stored in the selected cell.

According to a non-limiting feature of the method, the second voltage is a power supply voltage of the memory device. The selection transistor is advantageously a NMOS transistor. Advantageously, the method also comprises applying a gate voltage on a gate of the selection transistor, the gate voltage being selected to limit the voltage applied across the magnetic tunnel junction.

According to another aspect, the invention relates to a method for polarizing selection transistors associated to a plurality of unselected memory cells of a memory array of a memory device, each memory cell of the memory array comprising a magnetic tunnel junction, the method comprising applying a first voltage greater than ground voltage on a source of the selection transistors and applying a second voltage greater than the first voltage (Vread) on the drain of the selection transistor.

According to a further aspect, the invention relates to a magneto resistive memory device comprising:

a memory array comprising a plurality of memory cells, at least one bit line associated to each memory cell of the plurality and at least one source line associated to each memory cell of the plurality, each memory cell presenting a magnetic tunnel junction associated to at least one selection transistor to selectively connect the at least one bit line, the magnetic tunnel junction and the at least one source line to define a read path, the selection transistor comprising a source connected to the bit line via the magnetic tunnel junction and a drain connected to the source line;

a peripheral block configured to:

applying a first voltage greater than ground voltage on the bit line and applying a second voltage greater than the first voltage on the at least one source line;

activating the at least one selection transistor of a selected memory cell to flow a read current in the read path from the at least one source line to the bit line;

detecting the state stored in the selected cell by using a sense amplifier of the peripheral block associated with the at least one bit line to sense the current flowing in the bit line.

According to further non-limiting features of the invention, either taken alone or in any technically feasible combination:

the selection transistor is a NMOS transistor;

the peripheral control block comprises a multiplexer disposed between a plurality of bit lines of the memory array and the sense amplifier;

the multiplexer comprises a plurality of PMOS transistors each presenting a source, and respectively connected by their sources to the plurality of bit lines;

each PMOS transistor presents a gate connected to a control signal provided by a main control block, the control signal defining the first voltage on the bit line.

BRIEF DESCRIPTION OF THE FIGURES

Many other features and advantages of the present invention will become apparent from reading the following detailed description, when considered in conjunction with the accompanying drawings, in which:

FIG. 1a to FIG. 1d illustrates the polarization during a read operation of magneto resistive memory cells according to different known architectures;

FIG. 2 represents a column of memory cells according to the architecture of FIG. 1a;

DETAILED DESCRIPTION

To keep the representations simple, only the elements relevant to the description of the present invention have been included in the figures. A memory device taking profit of the proposed read method may comprise further elements not included into the figures. In particular, this disclosure does not describe in detail the write method of a memory cell, this method operating according to the state of the art.

General Description of the Magneto Resistive Memory Device

Figure 3:
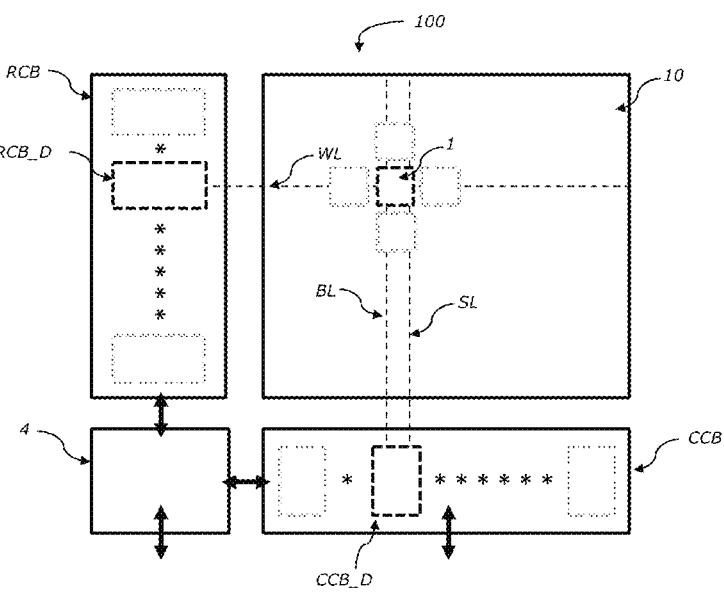
FIG. 3 represents a memory device according to the invention.

FIG. 3 represents a magneto resistive memory device 100 according to the invention.

Figures 4A, 4B, 4C:
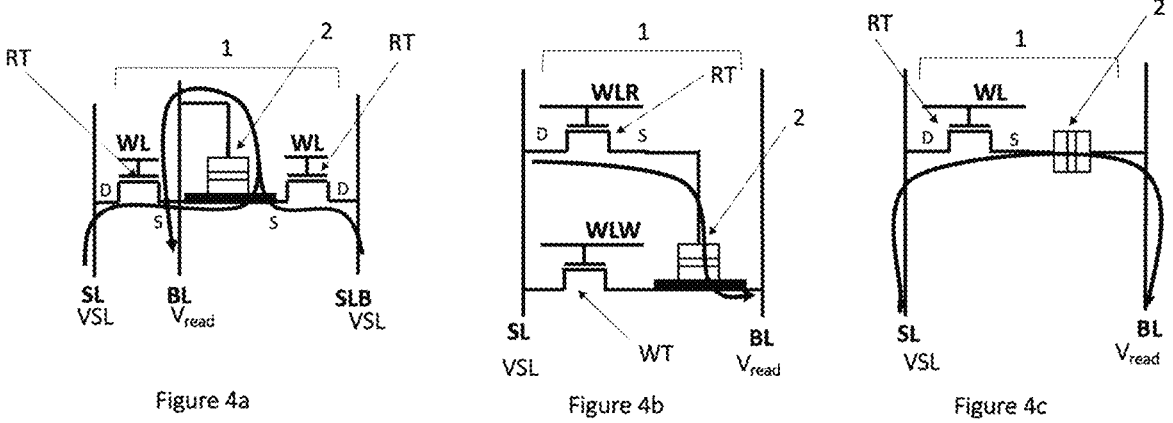
FIG. 4a to FIG. 4d illustrates the polarization according to the invention during a read operation of magneto resistive memory cells according to different architectures.
Figure 4D:
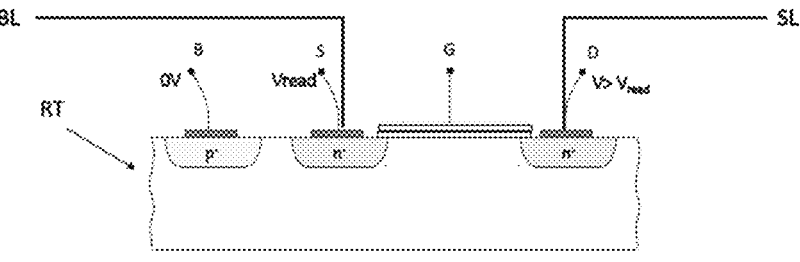

In this memory device 100, a large number of memory cells 1, presenting for instance an architecture according to one of the architectures represented on FIGS. 4a to 4c, are provided in rows and columns to form a memory cell array 10.

Each memory cell 1 of the array 10 is presenting a magnetic tunnel junction 2. The magnetic tunnel junction of a memory cell 1 comprises a magnetic free layer, the magnetization orientation of the magnetic free layer defining a state of the memory cell 1. The characteristics of the memory cell 1 have been recalled in the introduction of this application in reference to FIGS. 1a-1c and will not be reproduced here for the sake of brevity, but those characteristics fully apply to the memory cell 1 of a memory array according to the invention. The memory cell may be notably of the SOT type or of the STT type.

The memory array 10 also comprises bit lines BL and source lines SL arranged along respective columns of memory cells 10. Selection lines WL are arranged along respective rows of the memory cells array 10.

More specifically, in a magnetic memory array 10 according to the invention a bit line BL and at least one source line SL, SLB are associated with a plurality of memory cells. Each memory cell presents a magnetic tunnel junction 2 and at least one selection transistor RT to selectively connect the bit line BL, the magnetic tunnel junction 2 and the at least one source line SL, SLB, to define a read path through the magnetic tunnel junction 2. The selection transistor RT is controlled by the selection line WL, WLR. The selection transistor is preferably a NMOS transistor, NMOS transistors being generally of smaller size than PMOS transistors.

The memory device 100 according to the invention also comprises a peripheral block that can be constituted of a main control block 4, a row control block RCB and column control block CCB. The column control block CCB comprises the source line drivers and bit line drivers CCB_D respectively setting the voltage on the source line SL, SLB and bit lines BL. The column control block CCB also comprises sense amplifiers respectively connected (or connectable) to the bit lines BL to sense the current flowing therein. The row control block RCB comprises the row drivers RCB_D respectively setting the voltage on the selection lines WL, WLR to effectively select, in combination with the column control block CCB, one of the memory cells in at least one column of the array.

A row of memory cells (or a plurality of memory cells in the row) may be collectively read, by activating the corresponding selection line WL, WLR by row drivers RCB_D of a row control block RCB, and by activating the bit lines BL and sources lines SL, SLB by respective column drivers CCB_D of a column control block CCB such that the read currents flows in the respective bit lines BL-source lines SL as this will be explained in greater details below. Sense amplifiers of the column control block CCB, associated with the bit lines, measure the read current and determine the state stored in the respective memory cells. In certain embodiments, a sense amplifier may be shared among a plurality of bit lines, for instance through a multiplexer.

Typically, all the column drivers CCB_D are operated simultaneously to read respective data from at least one of the memory cells of a selected row, but this conventional mode of operation is not necessary.

A main control block 4 of the peripheral block is coordinating the read and write operations (not described in this disclosure). More particularly, the main control block 4 generates the control signals to the drivers of the column drivers CCB_D and to the row drivers RCB_D to achieve the sequence of steps necessary to perform the intended read operations of the cells of a given row. Some control signals generated by the main control block may also be addressed to the bit lines BL multiplexers, if such multiplexers are present, to selectively connect the sense amplifiers to selected bit lines BL of the memory array 10.

The control block 4 may implement a finite state machine, or more generally be configured, to generate the appropriate control signals, as this will be described in more details in a subsequent part of this disclosure. Input/output data may then be stored/retrieved from the magnetic memory device.

Method for Reading a State Stored in a Selected Memory Cell

Figure 8:
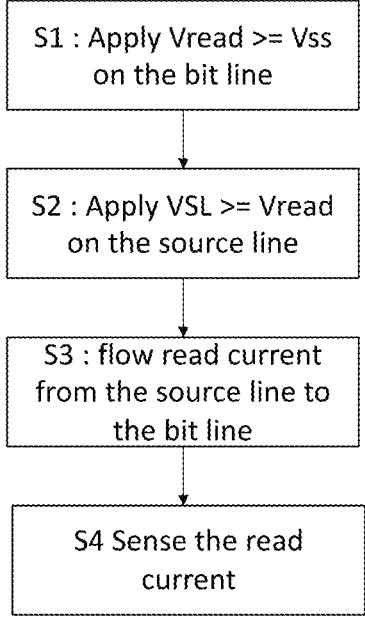
FIG. 8 represents a method according to the invention.

According to the invention, and with reference to FIG. 8, the method for reading the state of a selected memory cell of the memory device 100 comprises the following steps:

A first step S1 of applying a first voltage Vread greater than ground voltage Vss on the bit line and a step S2 of applying a second voltage VSL greater than the first voltage Vread on the at least one source line;

A step S3 of flowing a read current in the read path from the source line to the bit line;

A step S4 of sensing the read current and detecting the state stored in the selected cell.

Figures 1A, 1B, 1C, 1D, 2:
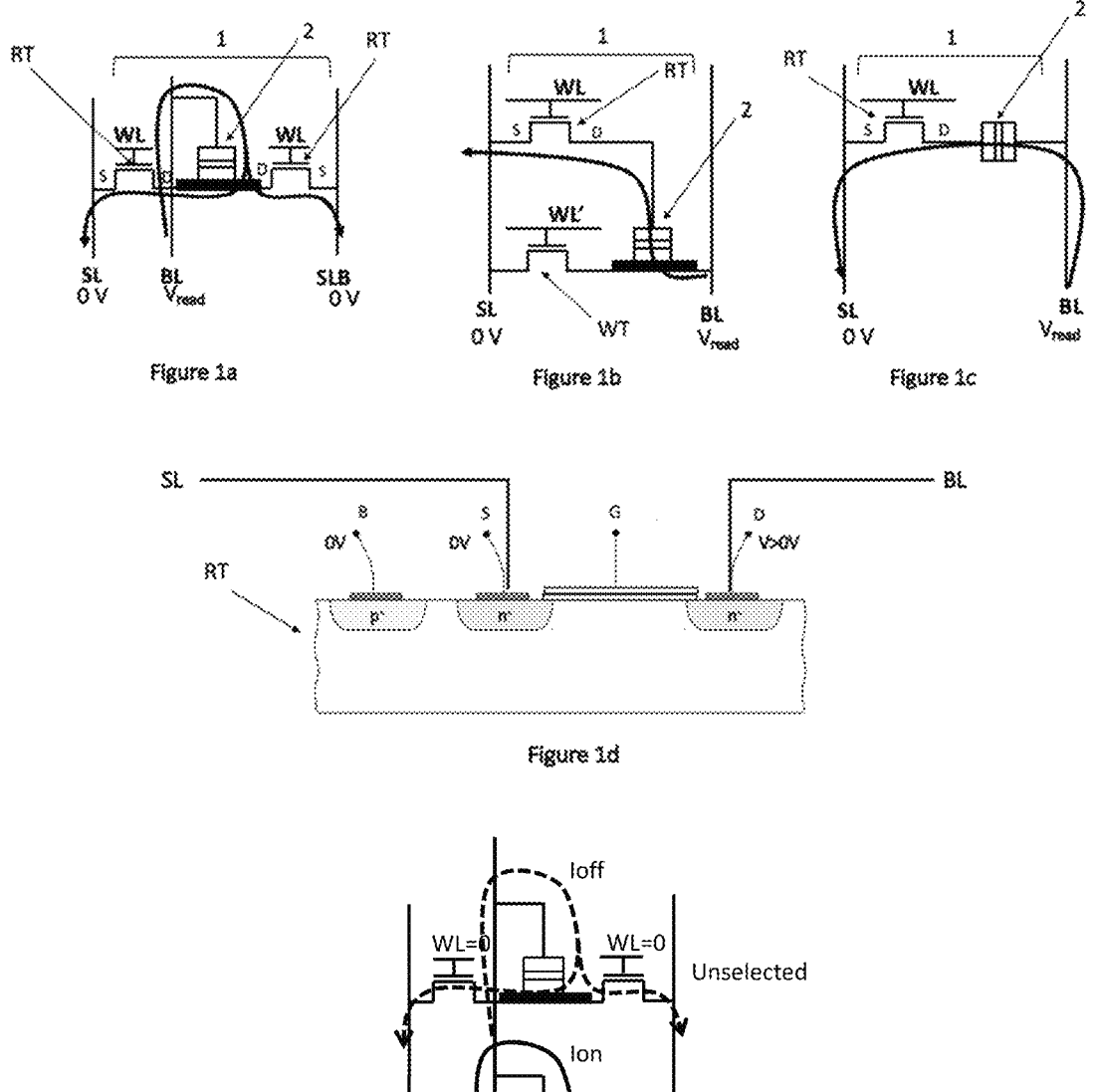

FIGS. 4a to 4c are further illustrations of this method, notably of the polarization of the selection transistor RT, for the three memory cell architectures of the FIG. 1a to 1c described in the introduction of the present disclosure and whose description will not be reproduced here for the sake of brevity.

The source line SL (and first and second source lines SL, SLB in FIG. 4a) may be shorted to power supply voltage Vdd of the memory device 100, and the bit line BL is set to a positive first voltage Vread, lower than the power supply voltage Vdd. But the invention is not limited to a second voltage VSL chosen to be the power supply Vdd, and more generally the second voltage may be chosen freely, as long as it exceeds the first voltage Vread.

Consequently, once a cell is selected using the selection line WL by closing the selection transistor RT, a read path is formed and current is flowing from the source line SL (from the first and second source lines SL, SLB in the architecture of FIG. 4a) to the bit line BL, and through the MTJ 2.

Figure 5:
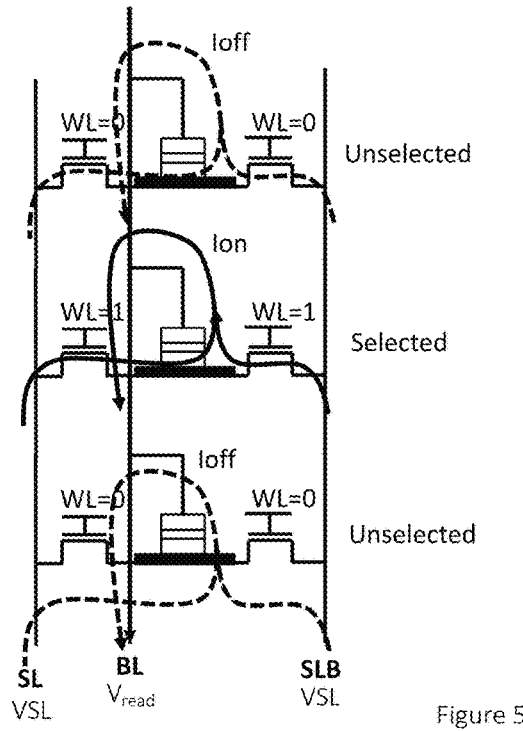
FIG. 5 represents a column of memory cells according to the architecture of FIG. 3c.

This first voltage Vread is controlled with respect to the second voltage (Vdd in the represented examples) such that the current Ion flowing in the read path is less than the write threshold voltage of this cell. As this is represented on FIG. 5, leakage currents Ioff are also flowing from the source lines SL, SLB, through the unselected memory cell to the bit line BL.

The state stored in the selected memory is detected by sensing the current flowing in the bit line using a sense amplifier of the column decoder block CCB connected to that bit line BL.

According to the invention, and as represented in the illustration of FIGS. 4a, 4b, 4c, 4d and 5, the selection transistor RT, usually an NMOS transistor as mentioned above, presents a gate connected to the selection line WL, a source connected to the bit line BL via the MTJ 2 and a drain connected to the source line SL. Hence the polarization of the selection transistor RT according to the invention is opposite to the polarization of the selection transistor RT according to the prior art.

The polarization of the selection transistor RT of the unselected memory cell according to the invention is particularly advantageous. The first voltage Vread applied on the source of the selection transistor RT is higher than ground voltage and induces a body effect in this transistor RT. Consequently, the threshold voltage of the selection transistor RT polarized according to the present invention is greater than the threshold voltage of the selection transistor RT polarized according to the state of the art. Also, for the unselected memory cells, the gate of the selection transistor RT being set to the ground voltage, the source to gate voltage Vgs is negative. In consequence of these two aspects, the leakage current Ioff flowing through the unselected selection transistor RT is reduced, without modifying the dimension or architecture of the selection transistor. In addition, and importantly, the polarization of the selection transistor RT for a selected memory cell can control the voltage applied to the MTJ2 thanks to the voltage applied on the gate G through the selection line WL. During the read operation, the selection transistor RT is in a follower mode. This means that the voltage of the source is equal to the voltage applied on the gate shifted by the threshold voltage. So, in the configuration represented in the figures, the voltage applied on the gate directly controls the voltage on the MTJ 2. Thanks to the configuration according to the invention, controlling the selection line WL voltage prevent over voltage which can deteriorate the MTJ.

Said differently, the method for reading the state stored in a selected memory comprises applying a voltage on the gate G of the selection transistor RT, this voltage being selected to limit the voltage applied across the magnetic tunnel junction 2.

Simulations have shown that in the architecture and polarization shown in FIGS. 4a to 4c, an NMOS selection transistor RT could exhibit a read current Ion of 10 microA, a leakage current Ioff of 20 pA, and hence a Ion/Ioff ratio of more than 500000. For recall, this ratio was evaluated at about 30 in the prior art architecture and polarization, that is almost 2000 time less, for the same read current Ion.

Consequently, the leakage currents Ioff flowing through the respective unselected memory cells are extremely reduced, and do not mask significantly the read current Ion flowing in the read path of the selected memory cell when all those current sums up into the bit line BL and into the sense amplifier SA associated with a column of memory cells.

Said differently, the present invention proposes an original polarization of a plurality of selection transistors RT respectively associated to a plurality of unselected memory cells 1 of a column of cells in a memory array 10. The method comprises applying a first voltage Vread, greater than ground voltage Vss, on the sources of the selection transistors RT, applying a ground voltage on the gates of the selection transistors and applying a second voltage VSL greater than the first voltage Vread on the drain of the selection transistor RT. By this approach, the leakage current of those unselected memory cells is reduced.

Figure 6:
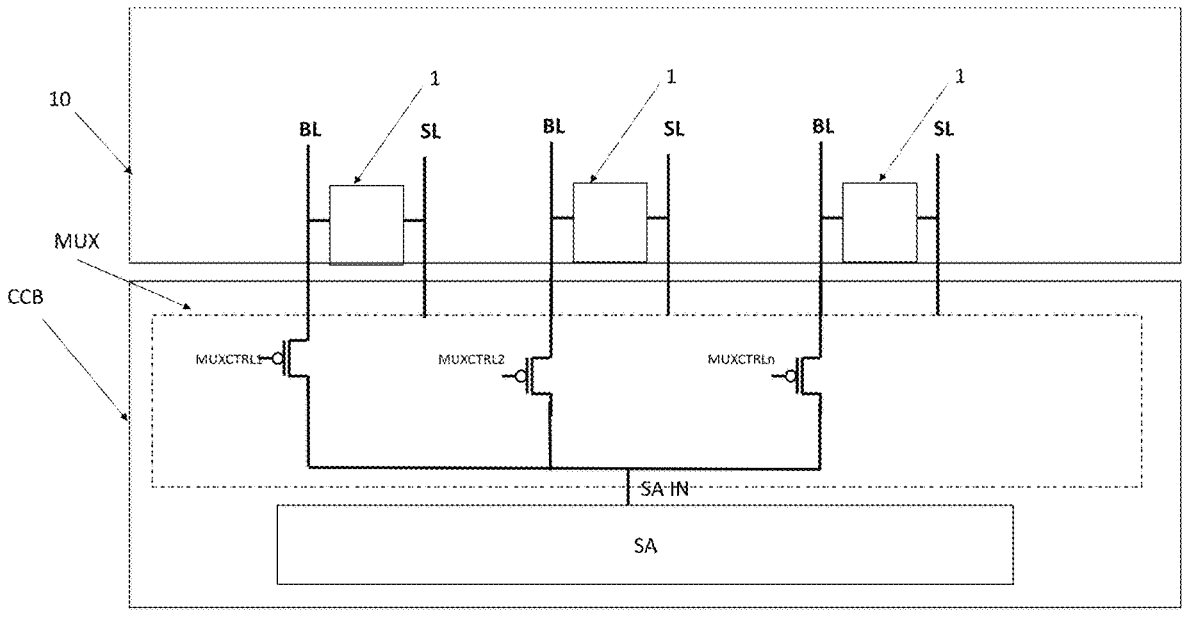
FIG. 6 represents column control block according to one embodiment.

According to a particular advantageous embodiment represented on FIG. 6, a sense amplifier SA of a column control block CCB is shared among multiple bit lines. The control block CCB comprises a multiplexer MUX, disposed between the memory array 10 and the sense amplifier SA. The multiplexer MUX is receiving control signal MUXC-TRL1, MUWCTRLn from the main control block to select which column, and more precisely which bit line BL, of the memory array is electrically connected to the input SA_IN of the sense amplifier SA. The column control block CCB typically comprises a plurality of multiplexers associated with a plurality of sense amplifiers, such that a plurality of memory cells 1 can be simultaneously read from the memory array 10, the plurality of memory cells 1 being disposed along the same row of the memory array 10.

The control signals MUXCTRL1, MUWCTRLn provided to the multiplexer MUX are dispatched to multiplexer transistors, typically PMOS transistors, respectively connected between the bit lines BL and the input of a sense amplifier SA.

In the configuration represented on FIG. 6, the selected multiplexer transistor is acting as a source follower, meaning that the source of this transistor (connected to the bit line BL of the memory cell 1 being read), is controlled to be equal to the voltage applied to its gate added to its threshold voltage. The multiplexer MUX not only allows to choose a selected column of cells 1 in the array 10, but also forms the bit line driver imposing the first voltage Vread to the bit line BL of the selected column.

Figure 7:
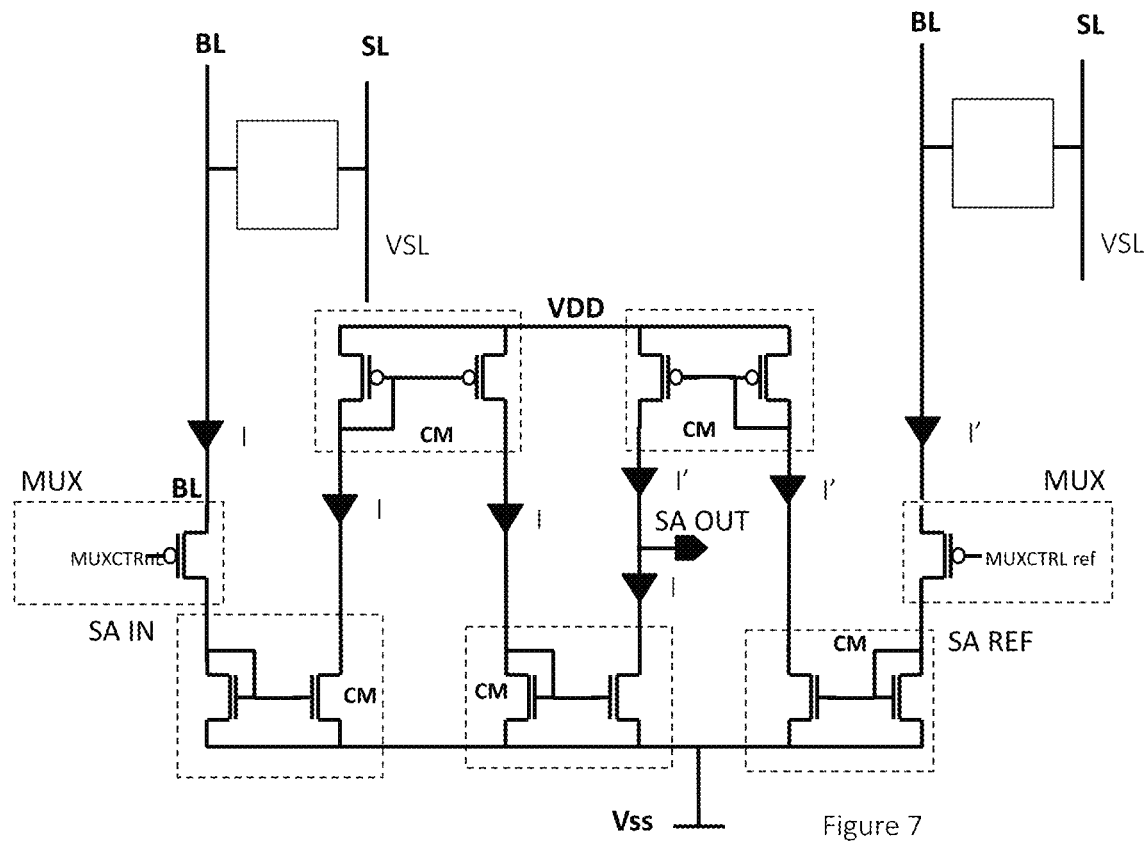
FIG. 7 represents a sense amplifier according to one embodiment.

FIG. 7 represents a possible sense amplifier SA circuit compatible with the principle of the present disclosure, in particular with the relative low voltage available on the sense amplifier input SA_IN, i.e. on the multiplexer transistor drain.

The sense amplifier of FIG. 7 presents two inputs, a first input SA_IN to receive the read current I flowing in the bit line BL associated to the memory cell intended to be read, and a second input SA_REF to receive a reference current I'. The reference current I' could be provided by the current flowing in the bit line BL associated to a reference memory cell. The sense amplifier SA of FIG. 7 also presents an output SA_OUT, providing the state of the read cell 1.

The sense amplifier SA is composed of a plurality of current mirror CM, duplicating the read current I and the reference current I' in parallel branches. In the output branch, the output of the sense amplifier SA_OUT is driven either to power supply voltage VDD if the reference current I' is greater than the read current I, or to ground voltage VSS if the read current I is greater than the reference current I'.

Other variations to the disclosed embodiments can be understood and effected by those skilled in the art in practicing the claimed invention, from a study of the drawings, the disclosure, and the appended claims.

In particular, the proposed polarization of the selection transistor may be applied to any memory cell configuration, for instance presenting a single bit line as the one represented in the figures, but also to other configurations including a plurality of bit lines per cell.

The invention claimed is:

1. A method for reading the state stored in a selected memory cell of a magneto resistive memory device comprising:

a memory array comprising a plurality of memory cells, at least one bit line (BL) associated to each memory cell of the plurality and at least one source line (SL, SLB) associated to each memory cell of the plurality, each memory cell presenting a magnetic tunnel junction associated to at least one selection transistor (RT) to selectively connect the at least one bit line (BL), the magnetic tunnel junction and the at least one source line (SL, SLB) to define a read path, the selection transistor (RT) comprising a source connected to the bit line (BL) via the magnetic tunnel junction and a drain connected to the source line (SL);

a peripheral block (4,CCB,RCB) comprising a sense amplifier (SA) associated with the at least one bit line (BL) to determine a read current flowing along the read path;

the method comprising:

applying a first voltage (Vread) greater than ground voltage on the bit line (BL) and applying a second voltage (VSL) greater than the first voltage (Vread) on the at least one source line (SL, SLB);

flowing a read current in the read path from the at least one source line (SL, SLB) to the bit line (BL);

sensing the current flowing in the bit line (BL) and detecting the state stored in the selected cell.

2. The method of claim 1 wherein the second voltage is a power supply voltage (Vdd) of the memory device.

3. The method of claim 1 wherein the selection transistor a NMOS transistor.

4. The method of claim 1, wherein the method comprises applying a gate voltage on a gate of the selection transistor, the gate voltage being selected to limit the voltage applied across the magnetic tunnel junction.

5. A magneto resistive memory device comprising:

a memory array comprising a plurality of memory cells, at least one bit line (BL) associated to each memory cell of the plurality and at least one source line (SL, SLB) associated to each memory cell of the plurality, each memory cell presenting a magnetic tunnel junction associated to at least one selection transistor (RT) to selectively connect the at least one bit line (BL), the magnetic tunnel junction and the at least one source line (SL, SLB) to define a read path, the selection transistor (RT) comprising a source connected to the bit line (BL) via the magnetic tunnel junction and a drain connected to the source line (SL);

a peripheral block configured to:

apply a first voltage (Vread) greater than ground voltage (Vss) on the bit line (BL) and applying a second voltage (VSL) greater than the first voltage (Vread) on the at least one source line (SL, SLB);

activate the at least one selection transistor (RT) of a selected memory cell to flow a read current in the read path from the at least one source line (SL, SLB) to the bit line (BL); and detect the state stored in the selected cell by using a sense amplifier (SA) of the peripheral block associated with the at least one bit line (BL) to sense the current flowing in the bit line (BL).

6. The magneto resistive memory device according to claim 5 wherein the selection transistor is a NMOS transistor.

7. The magneto resistive memory device according to claim 5, wherein the peripheral control block comprises a multiplexer (MUX) disposed between a plurality of bit lines (BL) of the memory array and the sense amplifier (SA).

8. The magneto resistive memory device according to claim 7, wherein the multiplexer (MUX) comprises a plurality of PMOS transistors each presenting a source, and respectively connected by their sources to the plurality of bit lines (BL).

9. The magneto resistive memory device according to claim 8, wherein each PMOS transistor presents a gate connected to a control signal provided by a main control block, the control signal defining the first voltage (Vread) on the bit line (BL).

* * * * *